(12) United States Patent
Tucker

(10) Patent No.: US 6,489,779 B1
(45) Date of Patent: Dec. 3, 2002

(54) SYSTEM AND METHOD FOR TERMINAL SHORT DETECTION

(75) Inventor: Scott Tucker, Raleigh, NC (US)

(73) Assignee: Mitsubishi Electric and Electronics, U.S.A., Inc, Durham, NC (US)

( * ) Notice: Subject to any disclaimer, the term of this patent is extended or adjusted under 35 U.S.C. 154(b) by 65 days.

(21) Appl. No.: 09/587,980

(22) Filed: Jun. 6, 2000

(51) Int. Cl.[7] .............................................. G01R 31/08
(52) U.S. Cl. ..................................................... 324/522
(58) Field of Search ................................ 324/522, 512, 324/525, 527, 546; 714/4, 56, 718, 719; 710/131; 360/31, 46; 703/18

(56) References Cited

U.S. PATENT DOCUMENTS

| 4,268,905 | A | | 5/1981 | Johann et al. | |
|---|---|---|---|---|---|
| 4,746,869 | A | | 5/1988 | Schrag et al. | |
| 5,081,404 | A | | 1/1992 | Kelley et al. | |
| 5,159,516 | A | | 10/1992 | Fujihira | |
| 5,210,475 | A | | 5/1993 | Juzswik et al. | |
| 5,457,391 | A | * | 10/1995 | Shimizu et al. | 324/546 |
| 5,483,404 | A | | 1/1996 | Nakano | |
| 5,726,821 | A | | 3/1998 | Cloke et al. | |
| 5,761,411 | A | * | 6/1998 | Teague et al. | 395/184.01 |
| 5,773,991 | A | | 6/1998 | Chen | |
| 6,104,199 | A | | 8/2000 | Sako | |

* cited by examiner

Primary Examiner—N. Le
Assistant Examiner—Etienne P. LeRoux
(74) Attorney, Agent, or Firm—Burns, Doane, Swecker & Mathis, L.L.P.

(57) ABSTRACT

Shorts are detected in terminals fed current by a driver connected to the terminals. To detect terminal-to-ground shorts, at least one virtual driver is connected to the driver for processing an output of the driver, and a detector detects if a short has occurred, based on an output of the virtual driver, by detecting when an output of the virtual driver exceeds a first threshold. If the detector detects that the output of the virtual driver has exceeded the first threshold, this indicates a terminal-to-ground short. To detect terminal-to-terminals shorts, a detector detects when an output of the driver drops below a second threshold. If the detector detects that the output of the driver has dropped below the second threshold, this indicates a terminal-to-terminal short. Shorts may be detected in terminals in one or more write heads. The driver, virtual driver, and detector may be included in a preamplifier. Detecting shorts in this manner avoids the loss of data without impeding performance of the write driver.

38 Claims, 5 Drawing Sheets

SYSTEM AND METHOD FOR TERMINAL SHORT DETECTION

BACKGROUND

This invention relates generally to a system and method for detecting terminal shorts. More specifically, this invention relates to a system and method for detecting a terminal-to-terminal short and/or a terminal-to-ground short in a write head.

In conventional rotating disk data storage devices, one or more read/write heads, typically magneto resistive and inductive heads, respectively, including positive and negative terminals, are used to write data on and read data from an associated disk media surface. Such an arrangement is shown in FIG. 1 in which a disk assembly 100 is connected to a host system, a memory, e.g., a RAM 160, and a CPU 170 via an interface adaptor 150. The host system supplies control signals and data to be written to the disk assembly 100 and receives read data from the disk assembly 100 via the interface adaptor 150. The CPU 170 controls, e.g., basic disk drive functions, based on information stored in the RAM 160.

The disk assembly 100 includes a preamplifier 30 supplied voltage by a positive voltage supply and connected to the heads 20 via flexible attachments 25. The preamplifier 30 receives from an associated channel device 40 both data signals to be written onto a disk 10 during a write operation, as well as control signals used to specify the individual read/write head 20 to be selected for a read or write operation. Data is supplied to the channel device 40 via a controller 50 connected to the interface adaptor 150. The preamplifier 30 also typically supplies analog data signals read from the head 20 to the associated channel device 40. A spindle motor 80 rotates the disks 10 under the control of a spindle motor controller 90. An actuator motor, e.g., a voice coil motor 60, moves the heads 20 to tracks at different radial positions on the disks 10 under the control of a position system 70 in response to control signals from the channel device 40.

The manufacture of disk drive assemblies is becoming more complex as additional read/write heads and corresponding additional disks are being included. Chances for assembly error are high since the heads and flexible attachments are often supplied by multiple sources in an effort to meet critical production quotas and schedules. Defects can occur during assembly due to, e.g., soldering across terminals, bent flexible attachments, etc. These defects can result in terminal-to-terminal shorts that can result in lost data or can cause terminal-to-ground shorts that can cause excessive currents that can damage the sensitive read/write heads as well as the preamplifier and will also result in lost data. Disk drive yield and manufacturing expenses can be improved if circuits for detecting head assembly defects can be included in the preamplifier.

Fault detection devices are known. For example, U.S. Pat. No. 5,081,404 discloses a motor driver fault detection circuit that measures a motor short-to-ground or short-to-supply voltage by directly monitoring the motor terminal voltages.

Devices are also known for detecting excessive currents in drivers when a short-to-ground occurs. For example, U.S. Pat. No. 5,773,991 discloses a motor current sensing circuit that includes a mirrored H-bridge driver that mirrors current from the actual driver. Current is sensed by measuring the voltage across a resistor that takes the place of the motor in the mirrored driver. U.S. Pat. No. 5,483,404 describes a method for over current detection in an H-bridge motor driver. This circuit senses a differential voltage across a resistor in series between a positive supply and an H-bridge driver.

If conventional designs such as these were employed for sensing a short-to-ground in a write head, a high current output from the positive voltage supply connected to the driver might cause the driver to saturate, though the current may not be due to a short but may, instead, be merely a high write current. Thus, using such designs may impede driver performance.

There is thus a need for a technique for detecting write head terminal-to-terminal shorts and terminal-to-ground shorts to avoid the loss of data, without impeding the performance of a write head driver.

SUMMARY

It is therefore an object of this invention to provide a system and method for detecting write head terminal-to-ground shorts and terminal-to-terminal shorts that will avoid the loss of data without impeding the performance of the write head driver.

According to exemplary embodiment, these and other objects are met by a system and method for detecting shorts in terminals fed current by a driver connected to the terminals.

According to a first embodiment, at least one virtual driver is connected to the driver for processing an output of the driver. A detector detects if a short has occurred, based on an output of the virtual driver. For this purpose, the detector detects when an output of the virtual driver exceeds a first threshold. If the detector detects that the output of the virtual driver has exceeded the first threshold, this indicates a terminal-to-ground short. The shorts may be detected in terminals in one or more write heads. The driver, virtual driver, and detector may be included in a preamplifier. Detecting shorts in this manner avoids saturation of the driver due to high write current and avoids the loss of data.

According to a second embodiment, a detector detects if a short has occurred, based on an output of the driver. For this purpose, the detector detects when an output of the driver drops below a second threshold. If the detector detects that the output of the driver has dropped below the second threshold, this indicates a terminal-to-terminal short. These shorts may be detected in terminals in one or more write heads. The driver and detector may be included in a preamplifier. Detecting shorts in this manner avoids the loss of data.

BRIEF DESCRIPTION OF THE DRAWINGS

The features, objects, and advantages of the invention will become apparent by reading this description in conjunction with the accompanying drawings, in which like reference numeral refer to like elements and in which.

DETAILED DESCRIPTION

For illustrative purposes, the following description is directed to a write head terminal short detection system. It should be appreciated, however, that the invention is not so limited.

Figure 2:
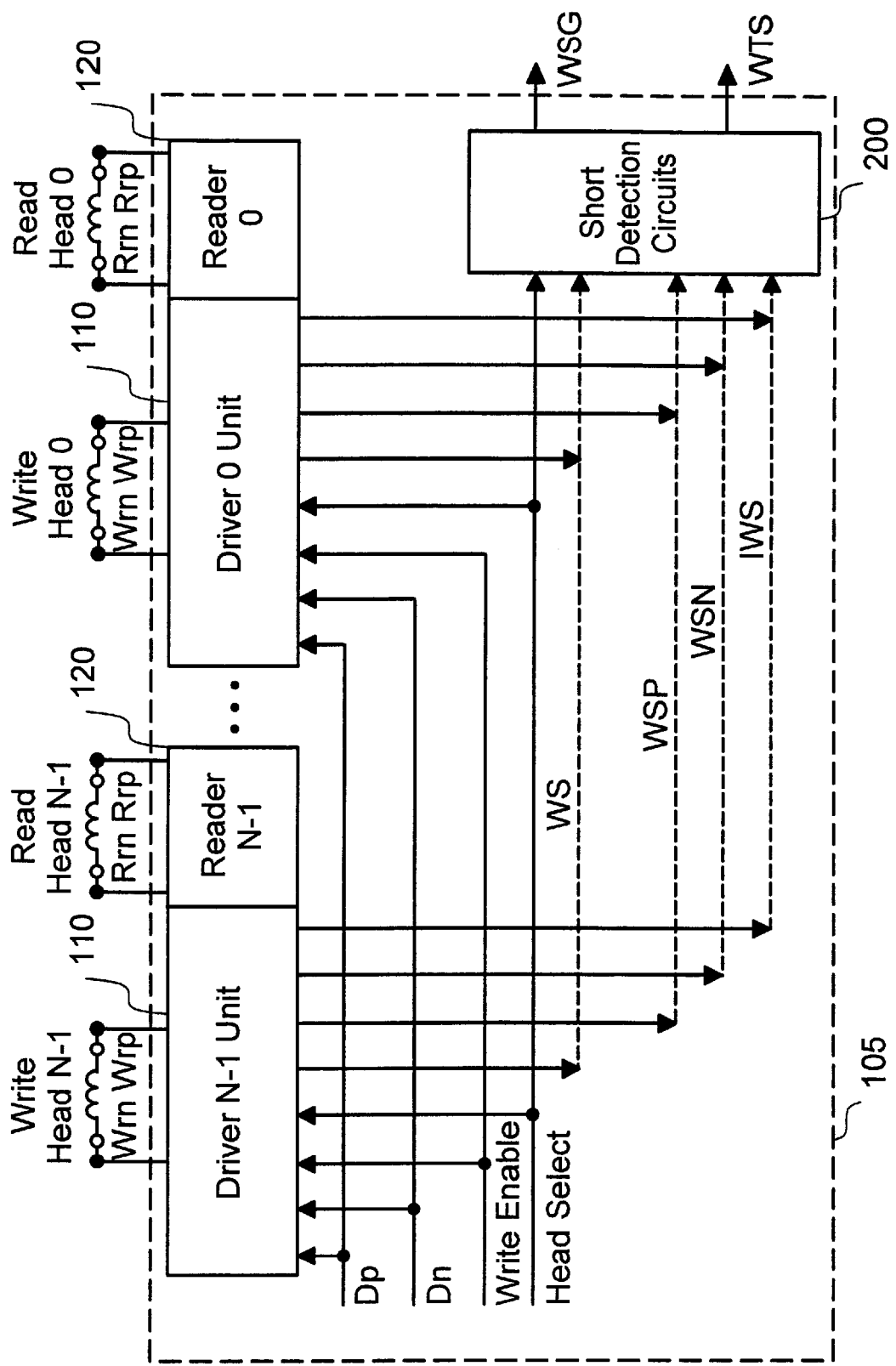
FIG. 2 illustrates an arrangement in which the invention may be implemented.

According to exemplary embodiments, critical write head terminals shorts can be detected in a preamplifier before and during normal write operations. A block diagram of an arrangement in which the invention may be implemented is shown in FIG. 2.

Figure 1:
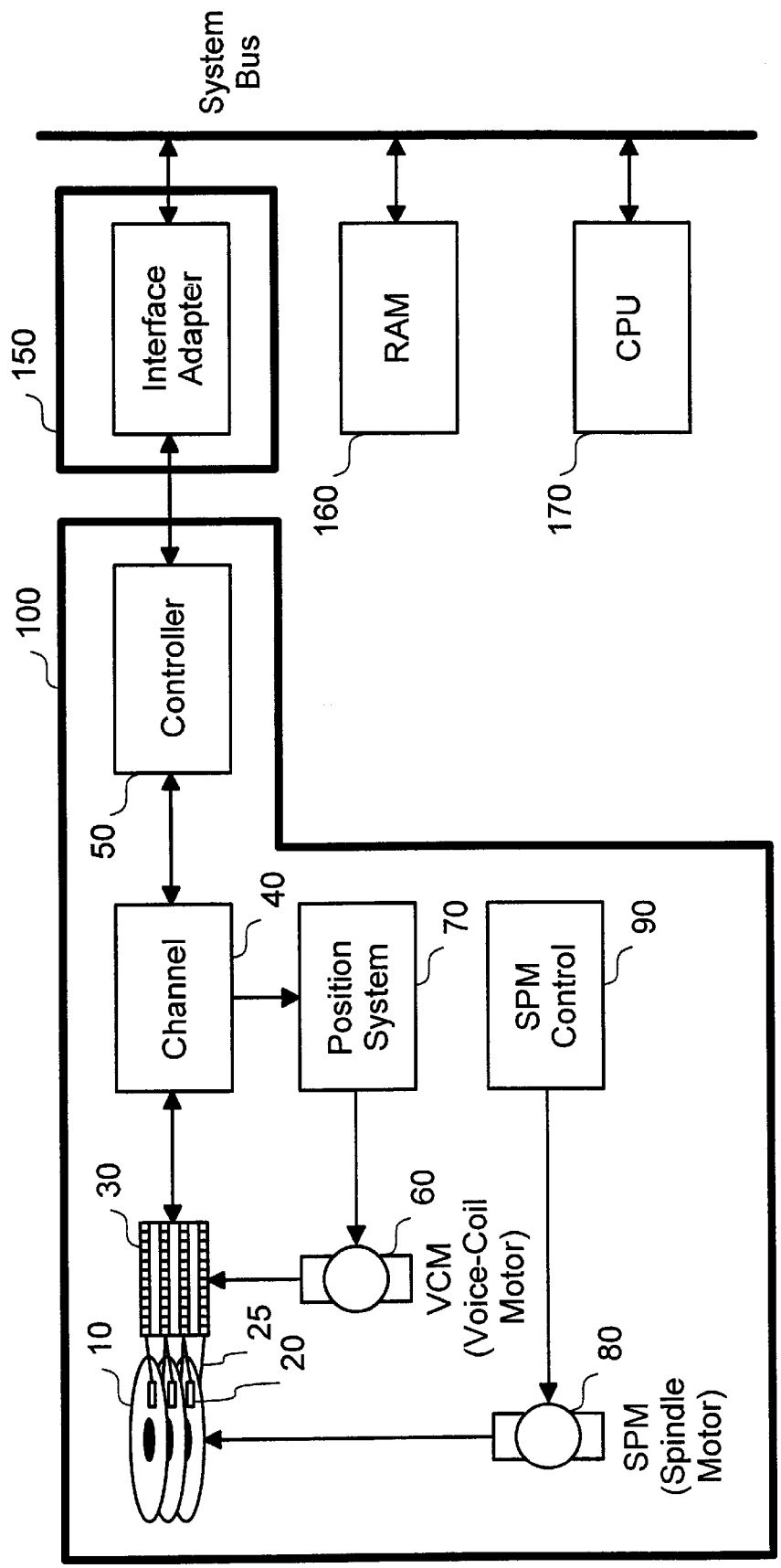
FIG. 1 illustrates a conventional read/write head arrangement.

The system includes N inductive read heads, N inductive write heads, and a preamplifier 105. Each write head includes a negative terminal Wrn and a positive terminal Wrp. Each read head includes a negative terminal Rrn and a positive terminal Rrp. The preamplifier 105 includes N driver units 110 and N readers 120. One driver unit and one reader is allocated to each pair of write and read heads. Data is supplied to the write heads from lines Dp and Dn via the drivers 110. The write heads are enabled by a signal delivered along the Write Enable line. A signal on the Head Select line selects one of the heads to write. The lines Dp, Dn, Write Enable and Head Select may be connected to a channel device such as that shown in FIG. 1.

According to exemplary embodiments, the driver unit 110 outputs signals used for detecting terminal shorts. A signal WS is used for detecting a terminal-to-ground short. Output signals WSP, WSN and Iws are used for detecting a terminal-to-terminal short. These signals are delivered to short detection circuits 200.

The short detection circuits 200 may include two circuits, one of which detects shorts across the positive and negative write terminals, and one of which detects a write terminal-to-ground short. Signals WSG and WTS are fault signals that represent a write terminal-to-short and a write terminal-to-ground short, respectively. For example, when the current WS is high, it causes the short detection circuits 200 to output a high signal WSG, indicating a terminal-to-ground short. When the signals WSP and the signal WSN are low, the short detection circuits 200 output a high voltage WTS, indicating a terminal-to-terminal short. These signals are output to, e.g., a register, drive an LED, a signal channel chip, etc. If a terminal-to-ground short is detected, the writer current may be quickly disabled to avoid damage to the inductive transducer and the preamplifier.

Figure 3:
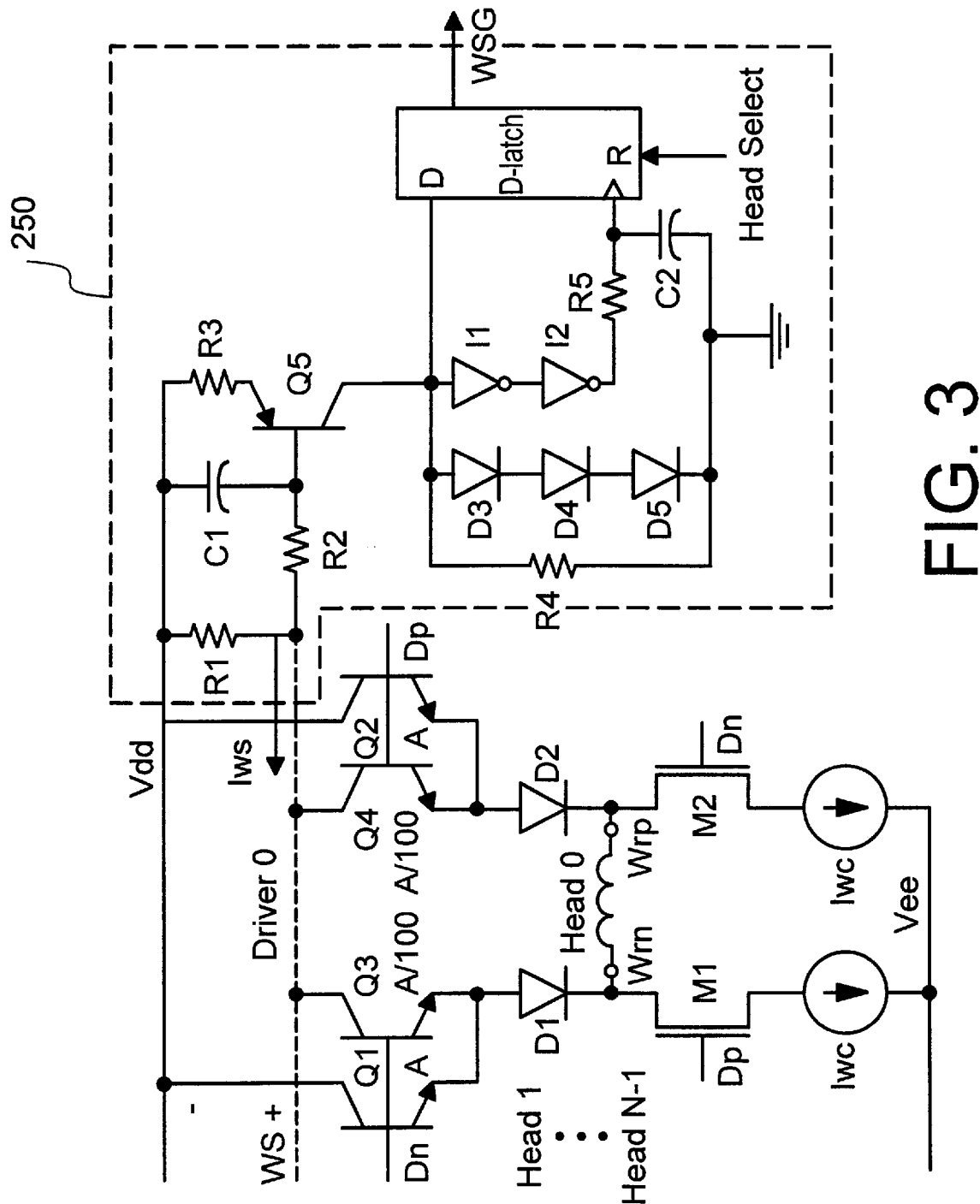
FIG. 3 illustrates an exemplary system for terminal-to-ground short detection according to a first embodiment.

FIG. 3 illustrates a write head terminal-to-ground short detection system according to a first embodiment. An H-bridge driver and a virtual driver are connected to a terminal-to-ground short detection circuit 250. The H-bridge driver and the virtual driver are included in the driver unit 110, and the terminal-to-ground short detection circuit 250 is included in the short detection circuits 200. The H-bridge driver includes transistors Q1 and Q2, MOSFETs M1 and M2, diodes D1 and D2 and current mirrors Iwc. When an input data signal Dp is high, transistor Q2 and MOSFET M1 conduct current in one direction through Head 0. When the input data signal Dp is low, Q1 and M2 conduct current in the reverse direction through Head 0.

The virtual driver is compatible with the H-bridge driver and includes transistors Q3 and Q4. The transistors Q3 and Q4 are sized to pull about 0.01 Iwc through a resistor R1 as each one conducts, alternately.

The terminal-to-ground short detection circuit 250 is connected to all of the drivers and includes resistors R1, R2, R3, R4, and R5, transistor Q5, capacitors C1 and C2, inverters I1 and I2, diodes D3, D4, and D5, a D-latch. Under normal operation, the current Iws output from the driver through the resistor R1 is very small, so the transistor Q5 is in the cutoff region. However, if either the positive write terminal Wrp or the negative write terminal Wrn is shorted to ground, the current Iws through the resistor R1 increases dramatically, and the transistor Q5 enters the forward active region. Resistor R3 is sized to limit the collector current of the transistor Q5 as the base-emitter voltage of Q5 becomes more negative. Diodes D3–D5 keep the transistor Q5 from saturating as the voltage across the resistor R4 increases. The invertors I1 and I2, the capacitor C2, and the resistor R5 provide delay so that the fault will be latched correctly. The capacitor C1 and the resistor R2 form a low pass filter that attenuates the high frequency noise generated by the large write current switching at high speed. The signal WSG eventually goes high as the collector voltage of transistor Q5 is latched. The D-latch holds the fault signal WSG which may be used to disable the writer current, Iwc. Alternately, or in addition, the signal WSG may be processed by, e.g., logic devices (not shown), and an appropriate action may be taken to indicate the short to the user, e.g., powering of LED's. In exemplary embodiments, the D-latch is reset when a Head Select signal is enabled, indicating that a different head is selected.

Figure 4:
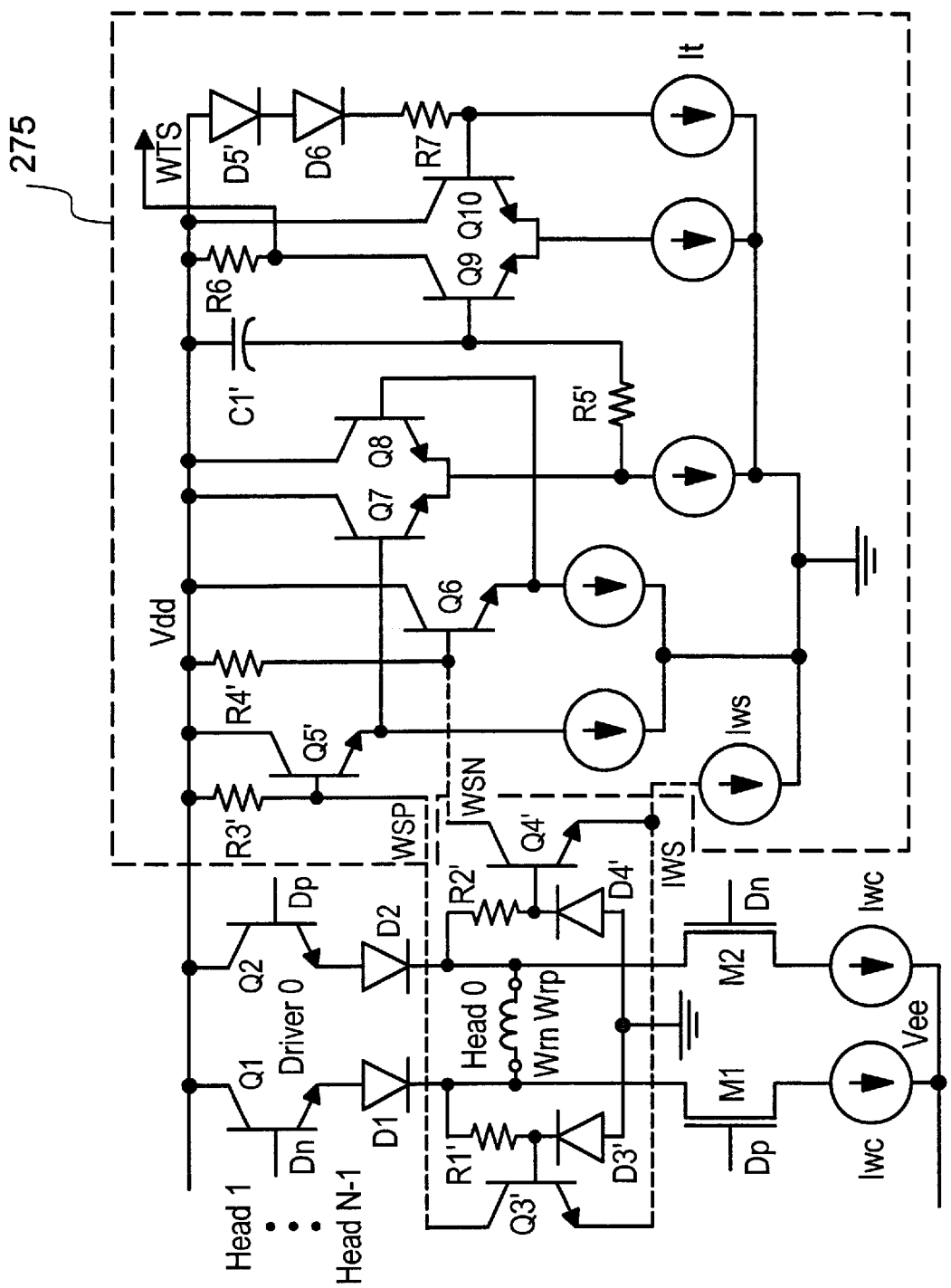
FIG. 4 illustrates an exemplary system for terminal-to-terminal short detection according to a second embodiment.

FIG. 4 illustrates a write head terminal-to-terminal short detection system according to a second embodiment. Similar to the system of FIG. 3, an H-bridge driver is connected to a terminal-to-terminal short detection circuit 275. The H-bridge driver is included in the driver unit 100, and the terminal-to-ground short detection circuit 275 is included in the short detection circuits 200. The H-bridge driver includes transistors Q1 and Q2, MOSFETs M1 and M2, diodes D1, and D2 and current mirrors Iwc. Transistors Q3', Q4' resistors R3', R4', and current sink Iws form a differential amplifier that senses the voltage across the selected write head terminals. Diodes D3' and D4' and resistors R1' and R2' ensure that the base voltages of the transistors Q3' and Q4' are never more than one base-emitter voltage drop below ground when a non-driven terminal swings to a negative voltage.

The differential pair of transistors Q3' and Q4' is designed to operate in two ways. In a normal write mode, the input signals WSN and WSP output from the write terminals are large enough to steer Iws from one side of the differential pair to the other. If the terminals are shorted, the input signals WSN and WSP are very small, so the differential pair will operate in the linear active mode. In this case, Q5' and Q6' level-shift and drive the outputs.

Resistors R3' and R4' and Iws are sized so that the transistors Q3' and Q4' are never saturated during normal performance. In addition, the current Iws must be large enough to drive the parasitic capacitances of the transistors Q3' and Q4' collector lines that are routed around the chip to the other drivers.

The terminal-to-terminal short detection circuit 275 includes transistors Q5', Q6, Q7, Q8, Q9 and Q10, resistors R3', R4', R5', R6, and R7, capacitor C1', diodes D5' and D6, and current sources. The current sources have to be high enough to drive the next stage. Resistor R5' and capacitor C1' filter the common emitter voltage. Transistors Q7 and Q8, resistor R5', and capacitor C1' form a peak detector circuit. The detector output varies about 500 mV depending on normal or shorted conditions. The peak detector is triggered based on whether the circuit is acting in a linear or a non-linear mode. For example, if the circuit is operating in a normal, non-linear mode, the peak detector output is high, e.g., 3.2 volts. If the circuit is operating in a linear mode, under shorted conditions, then the peak detector output drops, e.g., by 300 mV to 2.9 volts.

Transistors Q9 and Q10 and resistor R6 comprise a comparator with a threshold set by diodes D5 and D6, resistor R7 and It. The threshold is set so that during normal operation, there is a large difference between the voltages, i.e., there is a big voltage swing. If the comparator output is less than the threshold, the output WTS is high, e.g., Vdd=5 v, indicating a terminal-to-terminal short. Otherwise, the output WTS is low, e.g., Vdd−0.8 v=4.2 v, indicating no short. The signal WTS is processed, e.g., by logic devices (not shown), to a range of 0 to Vdd, and/or an appropriate action may be taken to indicate the short to a user, e.g., powering of LED's.

Figure 5:
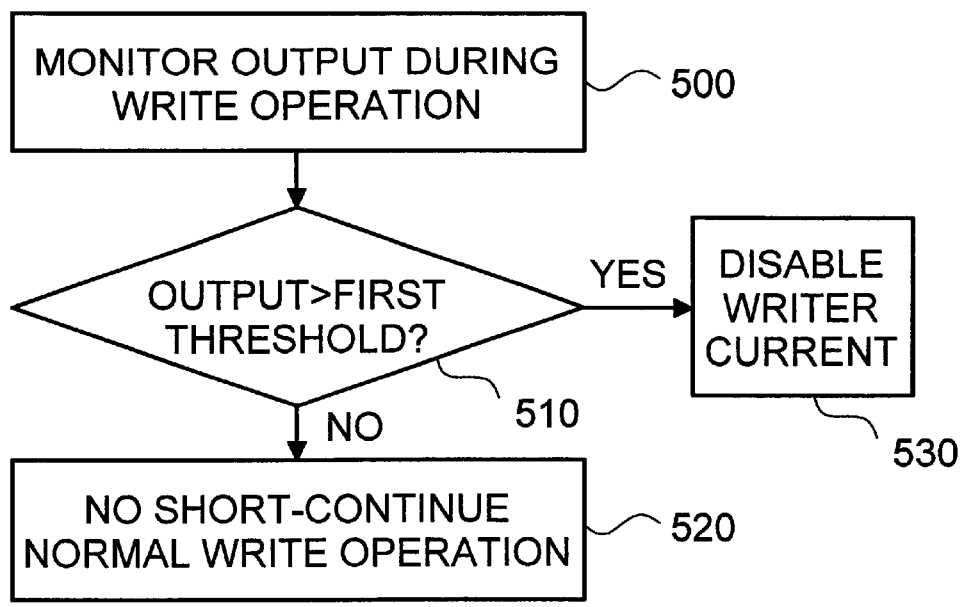
FIG. 5 illustrates a method for terminal-to-ground short detection according to the first embodiment.

FIG. 5 illustrates an exemplary method for detecting a terminal-to-ground short. The method begins at step 500 at which a current output Iws from the virtual driver through the resistor R1 is monitored. A determination is made at step 510 whether the voltage across R1 is greater than a first threshold, e.g., whether the voltage across R1 is significant enough that transistor Q5 enters the forward region. If not, there is not a short, and at step 520 the circuit continues in normal operation. If the voltage across R1 is greater than the threshold, a signal, e.g., WSG, is output to disable the writer current Iwc at step 530.

Figure 6:
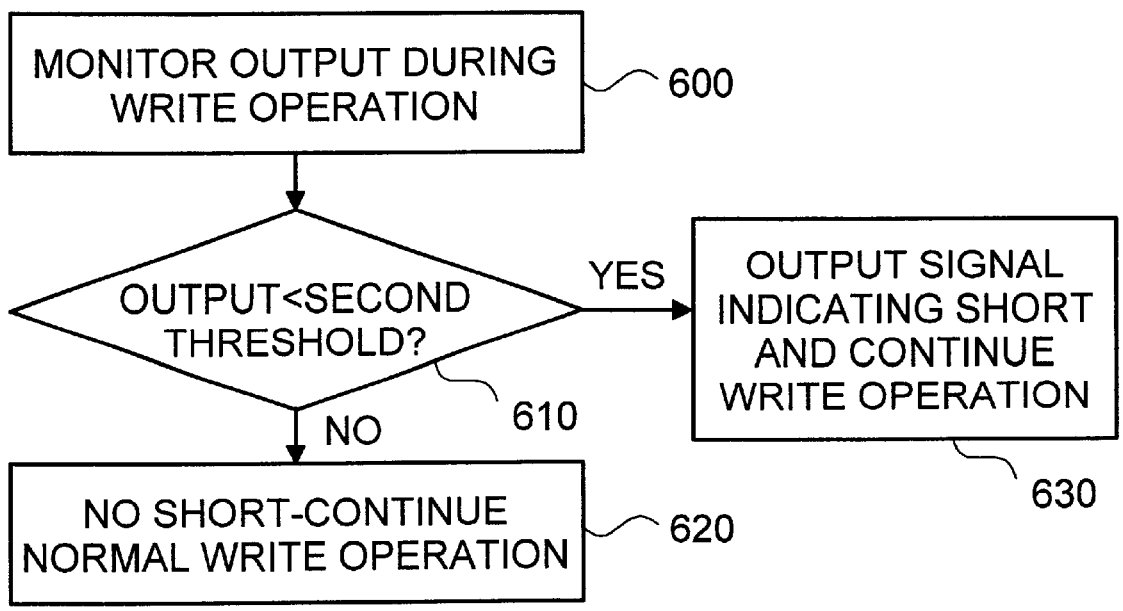
FIG. 6 illustrates a method for terminal-to-terminal short detection according to the second embodiment.

FIG. 6 illustrates an exemplary method for detecting a terminal-to-terminal short. The method begins at step 610 at which a voltage output from the driver is monitored, e.g., by a peak detector. The output of the peak detector is compared to a second threshold at step 610. At step 610, a determination is made whether the output is less than the second threshold. If not, there is not a short, and at step 620, the circuit continues in a normal write operation. Otherwise, a high signal WTS, indicating a short, is output at step 630. The circuit may still continue in a normal write operation, until forced to idle mode by some external means.

While FIGS. 3 and 5 and FIGS. 4 and 6 are described separately, it should be appreciated that the concepts illustrated in these figures may be combined, e.g., into a single system or method detecting both terminal-to-ground and terminal-to-terminal shorts.

Although described in the context of a write head system, it will be appreciated by those of ordinary skill in the art that this invention can be embodied in other specific forms without departing from its essential character. The embodiments described above should therefore be considered in all respects to be illustrative and not restrictive.

I claim:

1. A system for detecting defects in a write head including terminals and fed current by a driver connected to the terminals, the system comprising
   at least one virtual driver connected to the driver; and
   a detector for detecting if a short in the terminals has occurred based on an output of the virtual driver;
   wherein the virtual driver provides a portion of the current fed to the write head.

2. The system of claim 1, wherein the system detects a terminal-to-ground short.

3. The system of claim 2, wherein for detecting the terminal-to-ground short, the detector includes:
   means for sensing when an output of the virtual driver exceeds a predetermined threshold.

4. The system of claim 1, wherein the system detects shorts in a plurality of write heads, and at least one driver and at least one virtual driver are connected to the terminals of each head.

5. The system of claim 1, wherein the virtual driver and the detector are included with the driver in a preamplifier.

6. The system of claim 1, wherein the virtual driver provides approximately 1% of the current fed to the write head.

7. A system for detecting defects in a write head including terminals and fed current by a driver connected to the terminals, the system comprising:
   a sensor for detecting a voltage level across the terminals, the sensor including a differential amplifier having input terminals coupled to circuitry that ensures that a voltage at the input terminals never swings more than a predetermined amount below ground; and
   a detector for detecting if a short in the terminals has occurred based on an output of the sensor.

8. The system of claim 7, wherein the system detects a terminal-to-terminal short.

9. The system of claim 8, wherein for detecting the terminal-to-terminal short, the detector includes:
   means for detecting when an output of sensor falls below a predetermined threshold.

10. The system of claim 7, wherein the system detects shorts in a plurality of write heads, and at least one driver is connected to the terminals of each head.

11. The system of claim 7, wherein the sensor and the detector are included with the driver in a preamplifier.

12. The system of claim 7, wherein the circuitry that ensures that a voltage at the input terminals never swings more than a predetermined amount below ground comprises:
    a resistor having a first terminal connected to a respective write head terminal and a second terminal connected to an input terminal of the differential amplifier; and
    a diode having a first terminal connected to the second terminal of the resistor and a second terminal connected to ground.

13. A method for detecting shorts across terminals in a write head fed current by a driver connected to the terminals, comprising the steps of:
    processing an output of the write terminals in a virtual driver; and
    detecting if a short has occurred based on output of the virtual driver;
    wherein the virtual driver provides a portion of the current fed to the write head.

14. The method of claim 13, wherein the method detects a terminal-to-ground short.

15. The method of claim 14, wherein for detecting the terminal-to-ground short, the step of detecting includes:
    detecting whether an output of the virtual driver exceeds a predetermined threshold.

16. The method of claim 13, wherein the method detects shorts in a plurality of write heads, and at least one driver and at least one virtual driver are connected to the terminal of each head.

17. The method of claim 13, wherein the virtual driver is included with the driver in a preamplifier.

18. A method for detecting shorts across terminals in a write head fed current by a driver connected to the terminals, comprising the steps of:
    sensing a voltage level across the write terminals in a sensor, the sensor including a differential amplifier having input terminals coupled to circuitry that ensures that a voltage at the input terminals never swings more than a predetermined amount below ground; and
    detecting if a short has occurred based on the sensed voltage level.

19. The method of claim 18, wherein a terminal-to-terminal short is detected.

20. The method of claim 19, wherein for detecting the terminal-to-terminal short, the step of detecting includes:
   detecting whether the sensed voltage level falls below a predetermined threshold.

21. The method of claim 18, wherein the method detects shorts in a plurality of write heads, and at least one driver is connected to the terminals of each head.

22. The method of claim 18, wherein the sensor is included with the driver in a preamplifier.

23. A system for detecting shorts in terminals fed current by a driver connected to the terminals, comprising:
   at least one virtual driver connected to the driver; and
   a detector for detecting when an output of the virtual driver exceeds a predetermined threshold to determine if a short has occurred;
   wherein the virtual driver provides a portion of the current fed to the write head.

24. The system of claim 23, wherein if the detector detects that the output of the virtual driver has exceeded the predetermined threshold, this indicates a terminal-to-ground short.

25. The system of claim 23, wherein the system detects shorts in terminals in at least one write head.

26. The system of claim 23, wherein the virtual driver is included with the driver in a preamplifier.

27. A system for detecting shorts in terminals fed current by a driver connected to the terminals, comprising;
   a sensor for sensing a voltage level across the terminals, the sensor including a differential amplifier having input terminals coupled to circuitry that ensures that a voltage at the input terminals never swings more than a predetermined amount below ground; and
   a detector for detecting when an output of the sensor drops below a predetermined threshold to determine if a short has occurred.

28. The system of claim 27, wherein if the detector detects that the output of the sensor has dropped below the predetermined threshold, this indicates a terminal-to-terminal short.

29. The system of claim 27, wherein the system detects shorts in terminals in at least one write head.

30. The system of claim 27, wherein the sensor is included with the driver in a preamplifier.

31. A method for detecting shorts in terminals fed current by a driver connected to the terminals, comprising the steps of:
   processing an output of the driver in a virtual driver connected to the driver; and
   detecting when an output of the virtual driver exceeds a predetermined threshold to determine if a short has occurred;
   wherein the virtual driver provides a portion of the current fed to the write head.

32. The method of claim 31, wherein if the step of detecting detects that the output of the virtual driver has exceeded the predetermined threshold, this indicates a terminal-to-ground short.

33. The method of claim 31, wherein the system detects shorts in terminals in at least one write head.

34. The method of claim 31, wherein the virtual driver is included with the driver in a preamplifier.

35. A method for detecting shorts in terminals fed current by a driver connected to the terminals, comprising the steps of:
   sensing a voltage level across the terminals in a sensor, the sensor including a differential amplifier having input terminals coupled to circuitry that ensures that a voltage at the input terminals never swings more than a predetermined amount below ground; and
   detecting when an output of the sensor drops below a predetermined threshold to determine if a short has occurred.

36. The method of claim 35, wherein if the step of detecting detects that the output of the sensor has dropped below the predetermined threshold, this indicates a terminal-to-terminal short.

37. The method of claim 35, wherein the system detects shorts in terminals in at least one write head.

38. The method of claim 35, wherein the sensor is included with the driver in a preamplifier.

* * * * *